(12) United States Patent
Tsironis

(10) Patent No.: US 6,850,076 B2
(45) Date of Patent: Feb. 1, 2005

(54) MICROWAVE TUNERS FOR WIDEBAND HIGH REFLECTION APPLICATIONS

(75) Inventor: Christos Tsironis, 44 Caribou Crescent, Kirkland, Quebec (CA), H9J 2H8

(73) Assignee: Christos Tsironis, Kirkland (CA)

( * ) Notice: Subject to any disclaimer, the term of this patent is extended or adjusted under 35 U.S.C. 154(b) by 46 days.

(21) Appl. No.: 10/326,543

(22) Filed: Dec. 23, 2002

(65) Prior Publication Data

US 2004/0119481 A1 Jun. 24, 2004

(51) Int. Cl.[7] ............................................. G01R 27/04
(52) U.S. Cl. ....................... 324/637; 324/637; 324/638; 324/642
(58) Field of Search ................................. 324/638, 642

(56) References Cited

U.S. PATENT DOCUMENTS 6,297,649 B1 * 10/2001 Tsironis ....................... 324/642
6,674,293 B1 * 1/2004 Tsironis ....................... 324/638
2003/0107363 A1 * 6/2003 Tsironis ....................... 324/95
2003/0122633 A1 * 7/2003 Tsironis ....................... 333/17.3
2003/0132759 A1 * 7/2003 Tsironis ....................... 324/601

FOREIGN PATENT DOCUMENTS

CA        2311620 A1 * 9/2001 ........... G01R/27/00

* cited by examiner

Primary Examiner—Charles H. Nolan, Jr.

(57) ABSTRACT

High reflection load pull tuners are proposed, which include two or more RF probes, placed in series into the same slotted airline (slabline) and being controlled simultaneously horizontally and vertically by remote electric control, allowing the creation of controlled reflection factors which are distributed over and cover the entire Smith Chart, from very low reflection factors up to very high reflection factors and a method allowing to align such tuners and to calibrate such tuners on a vector network analyzer.

4 Claims, 5 Drawing Sheets

Setup for tuner calibration

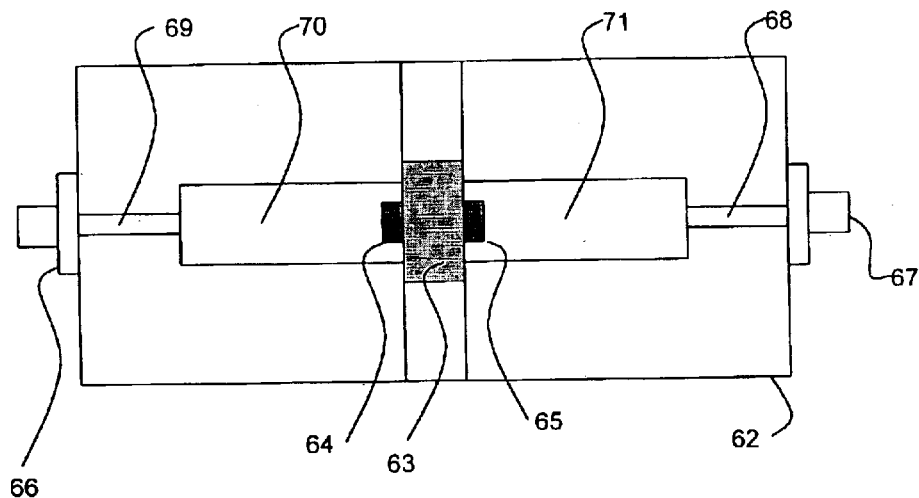
FIG. 1: Prior Art: Transforming networks on DUT test fixture
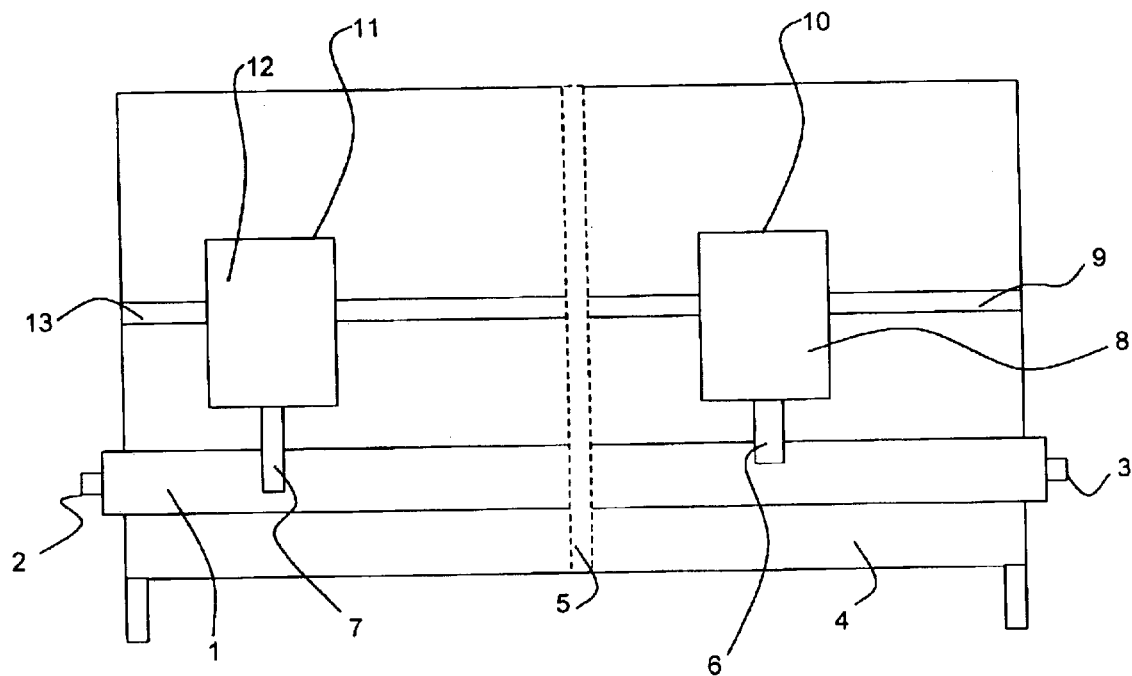
FIG. 2 Prior Art: Pre-matching tuner structure

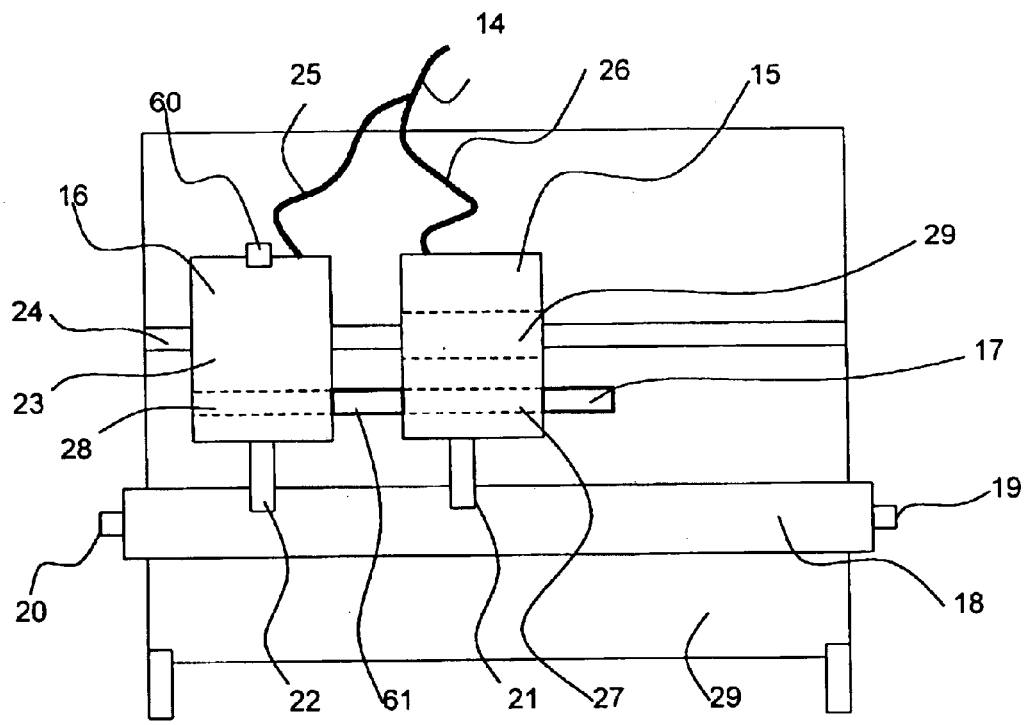
FIG. 3: Synchronized pre-matching tuner structure
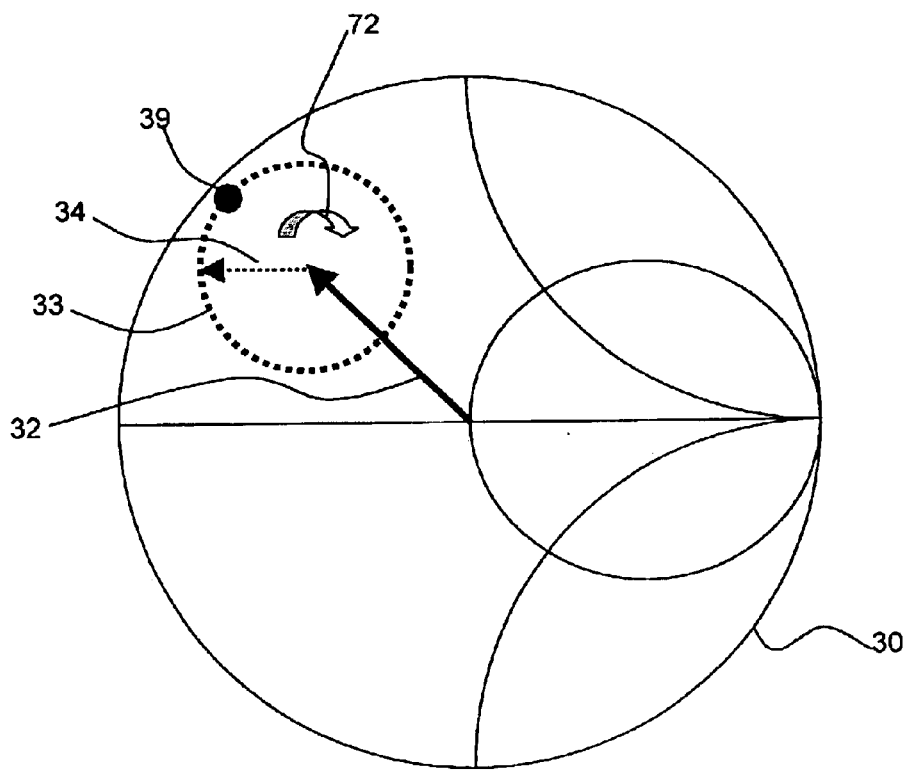
FIG. 4: Prior Art: Tuning mechanism of pre-matching tuner

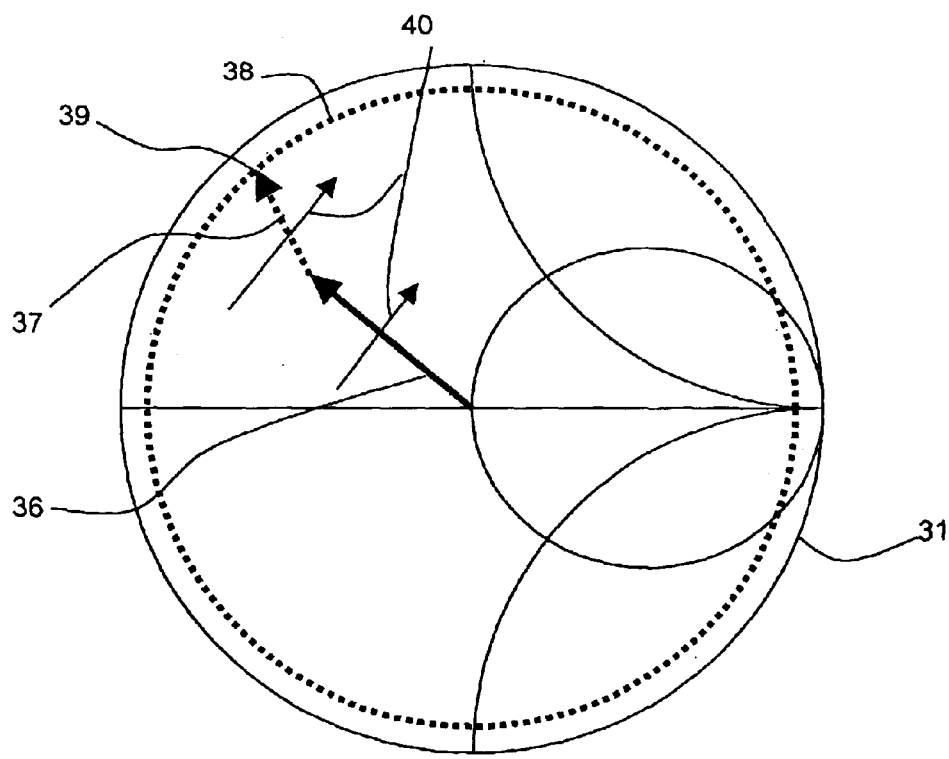
FIG. 5: Tuning mechanism of Synchronized pre-matching tuner
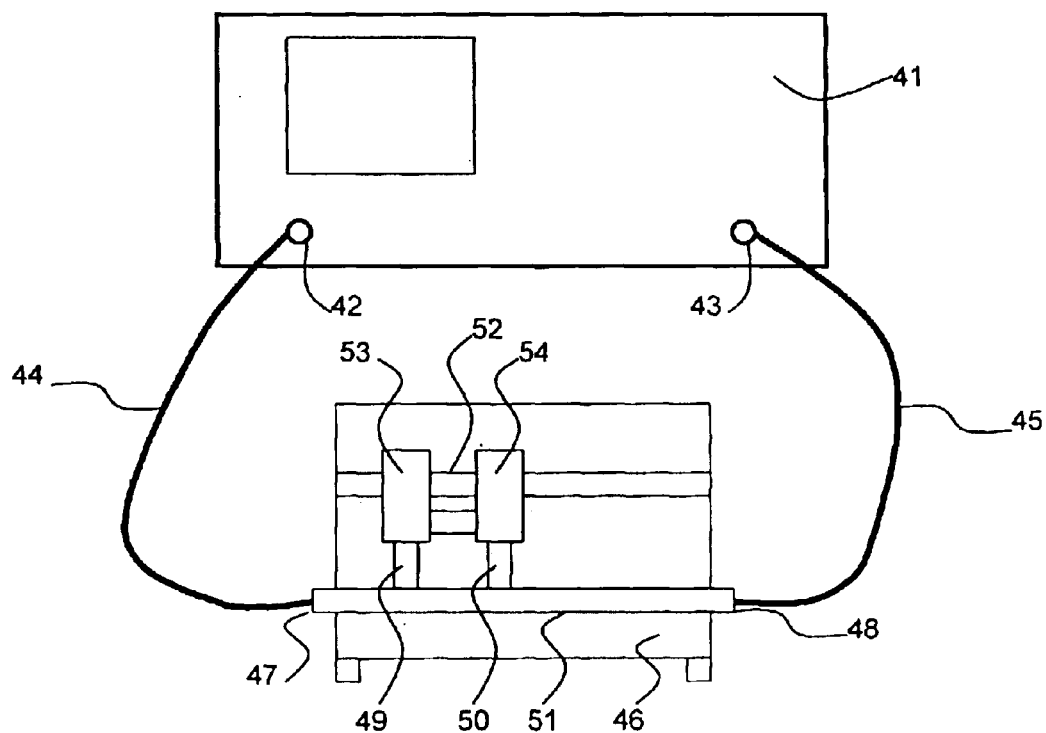
FIG. 6: Setup for tuner calibration

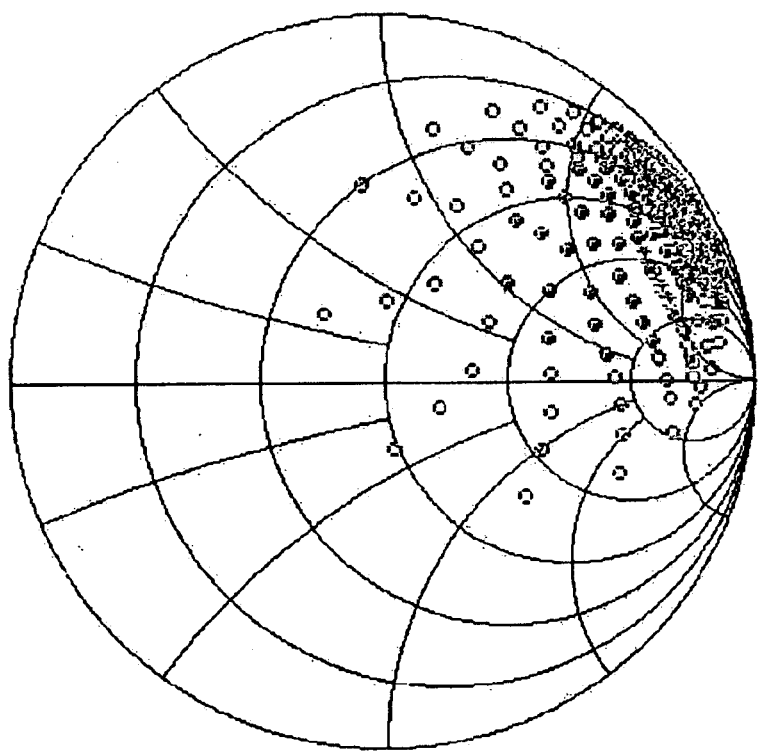
Figure 7: Prior Art: Calibration point distribution of pre-matching tuners

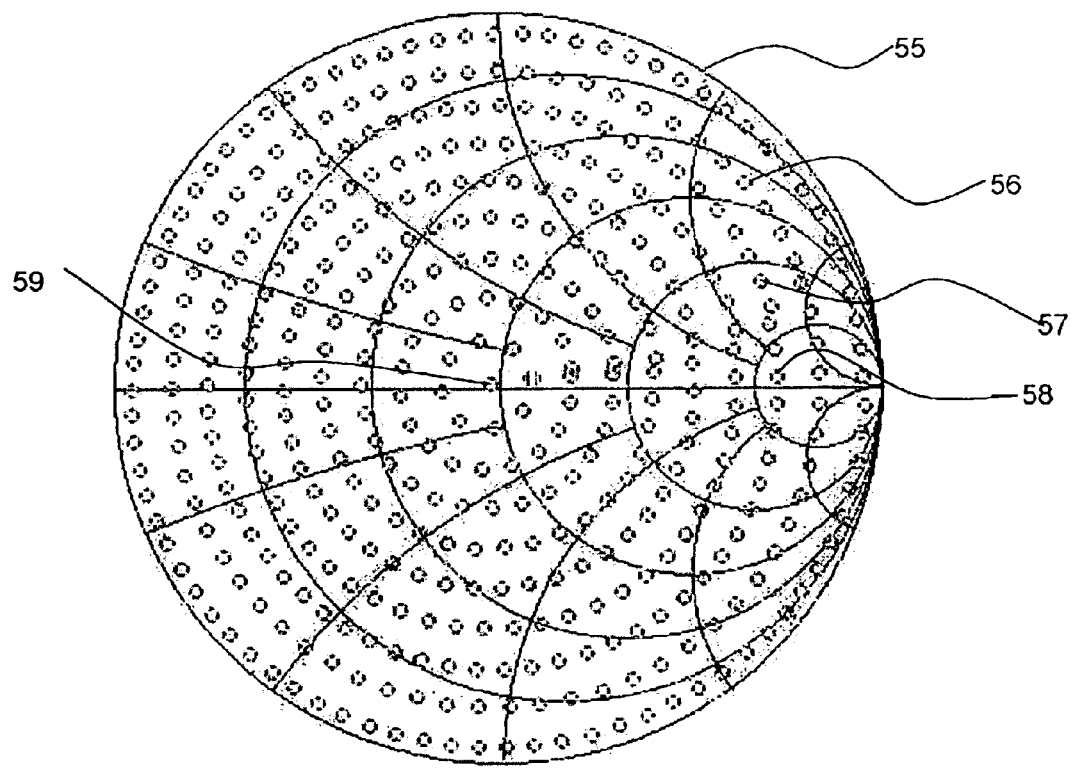
FIG. 8: Calibration point distribution of synchronized pre-matching tuners.

MICROWAVE TUNERS FOR WIDEBAND HIGH REFLECTION APPLICATIONS

CROSS-REFERENCE TO RELATED APPLICATIONS

Not Applicable.

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISC APPENDIX

Not Applicable

BACKGROUND OF THE INVENTION

1. Field of the Invention

This invention describes a new solution for obtaining user controlled high reflection factors using wideband load pull microwave tuners.

2. Description of the Prior Art

Microwave testing of low noise and high power semiconductor devices, such as transistors, require impedance generation microwave tuners. These tuners create a controlled reflection factor which is presented to the device under test (DUT) by means of test fixtures and other microwave transmission media. Modern microwave transistors, especially low noise and high power devices have very low or very high internal impedances at their input or output ports. In order to match those impedances using microwave impedance transformers, commonly called "microwave tuners" in the field, these tuners are required to be able to generate such very low or very high impedances themselves. Very low or very high impedances correspond invariably to very high reflection factors, close to 1. Such high reflection factors can be obtained actually using pre-matching networks and pre-matching tuners. These pre-matching tuners employ a pair of independently abjustable RF probes (slugs), which generate high reflection as a combination of two individual medium size reflections through vector addition of the reflection vectors [Prematching tuners for very high SWR and power and load pull measurements; Microwave Journal, January 2000, pages 176 ff.].

The solution of using pre-matching tuners in order to generate very high reflection factors has certain advantages but has also three shortcomings:

1. It can, when pre-matching is activated, allow very high reflection factors to be generated only in a small area of the Smith Chart close to and around the original pre-matching vector. Most other areas of the Smith Chart are not attained by the tuner and require re-adjustment of the pre-matching slug (FIGS. 4 and 7).

2. The size of pre-matching tuners is twice as large and up to 75% heavier than a normal single slug tuner, because each of both slugs has to be able to move independently over λ/2 to cover 360° reflection factor phase (FIG. 2)

3. The zero tuning position of the tuning section of the tuner is not 50Ω, since the pre-matching slug remains inserted in the airline (slabline) (FIG. 7)

4. Calibration time of pre-matching tuners is at least twice as long as normal tuners, if an optimized calibration technique is used, or much longer otherwise, because the tuner has to be calibrated for at least twice the number of positions, independently for each of the pre-matching and tuning sections.

The problem of high reflection factor tuning, required for Load Pull and Noise testing of high power and low noise transistors, using automatic or manual microwave tuners has been addressed up to date in different manners as follows:

1. Using (pre-matching) transforming networks (70,71) on the test fixtures (62) (FIG. 1) or "on-chip". This allows a static pre-matching, in which the characteristic impedance of the test system is transformed to be close to the conjugate complex of the internal impedance of the DUT (device under test, 63), thus making further tuning by the external controllable automatic or manual tuners of the test setup, connected to the ports (66,67) of the test fixture (62), easier and more accurate. This technique has been used for long time in RF technology, but has the disadvantage of not being able to cover a significant frequency bandwidth simultaneously or match a variety of DUT's (63) using the same transforming networks (70,71), which said networks must be re-designed and manufactured for other frequencies and DUT's with different internal impedance.

2. Using Pre-matching tuners (FIG. 2). These devices have the capability of generating very high reflection factors using two or more RF slugs (6,7) in series and positioning them in such a manner that a first RF slug (pre-matching slug, 7) is positioned inside the airline (1) such as to generate a reflection factor (32) close to the conjugate complex of the DUT's internal impedance. Then the second RF slug (tuning slug, 6) can tune easier and more accurately around the DUT's conjugate complex internal impedance (34), on a circle (33, 72). The theory and the experimental behavior behind this approach is basically the same as in case 1, i.e. adapting the characteristic impedance of the test system to the conjugate complex internal impedance of the DUT before proceeding to the actual tuning. This method has the advantage (compared with case 1) of being flexible, i.e. by adjusting the position and depth of the first RF slug (7), we can determine the actual position on the Smith Chart (30), to be close to the conjugate complex of the actual DUT internal impedance for various DUT's, frequencies and test conditions, without having to re-design the pre-matching networks as is the case in FIG. 1. As stated before, the disadvantage of such pre-matching tuners (4) is the fact that they cannot cover the whole area of the Smith Chart, when pre-matching is activated (33), FIG. 7, and they cannot reach very high reflection factors when pre-matching is not activated (32).

BRIEF SUMMARY OF THE INVENTION

To solve the problems inherent to pre-matching networks and tuners in prior art we propose an alternative solution, which we call "synchronized pre-matching" (FIG. 3) since such technique and term do not exist as yet within the scope of our knowledge, yet, in RF technology.

In order to avoid the shortcomings of the traditional pre-matching tuner approach we propose a new tuner structure, which uses two RF slugs, which can be adjusted to certain horizontal distance among themselves and constant relative vertical position, but move simultaneously after that, both horizontally and vertically. This new technique utilizes, in fact, a static kind of pre-matching mechanism, since the reflection vectors of both RF slugs are adding, but, since both slugs move simultaneously horizontally and vertically, the relative phase between the two reflection vectors does not change and by consequence the total reflection vector does not change in amplitude, when both slugs move horizontally (FIG. 5, FIG. 8), which is different from what happens with ordinary pre-matching tuners (FIG. 4, FIG. 7); instead the total vector can be adjusted by remote motor control of the vertical position of both RF slugs from a minimum value close to 0 (=50Ω), when both RF slugs are withdrawn simultaneously from the slabline to a maximum close to 0.95 when both the RF slugs are inserted to simultaneously to maximum depth inside the slablines (FIG. 8). This allows the new tuner to behave like an ordinary tuner with a single tuning slug, but with the high reflection capability of a pre-matching tuner.

BRIEF DESCRIPTION OF SEVERAL VIEWS OF THE DRAWINGS

The invention and its mode of operation will be more clearly understood from the following detailed description when read with the appended drawings in which:

FIG. 1 depicts a top of the Prior Art showing transforming networks on DUT test fixture.

FIG. 2 depicts a schematic front view of the Prior Art, showing the classical pre-matching tuner structure.

FIG. 3 depicts a schematic front view of the Synchronized pre-matching tuner structure.

FIG. 4 depicts a view of the Prior Art showing the tuning operation and mechanism of classical pre-matching tuner on a Smith Chart.

FIG. 5 depicts a view of the tuning operation and mechanism of the Synchronized pre-matching tuner.

FIG. 6 depicts a front view of the set-up for synchronized tuner calibration on an automatic vector network analyzer (VNA).

FIG. 7 depicts a view of the Prior Art showing the calibration point distribution of pre-matching tuners on a Smith Chart.

FIG. 8 depicts view of the calibration point distribution of Synchronized pre-matching tuners on the Smith Chart.

DETAILED DESCRIPTION OF THE INVENTION

This invention is described in the following with reference to the FIGS in which like numbers represent the same or similar elements:

We propose controllable microwave tuners, which include two or more RF slugs, connected in series in the same airline (or slabline for practical applications), (FIG. 3). The main difference to existing pre-matching tuners (FIG. 2) consists in the different way of controlling the position and the RF operation of the RF slugs (21,22), included in the new tuners (29). Instead of moving the two (or more) RF slugs (6, 7) in tuner (4) independently, the pre-matching slug (7) being positioned before the actual tuning with slug (6) starts, the new tuners (29) control both RF slugs (21,22) both horizontally and vertically simultaneously. This has a major effect on the RF behavior of the new tuners (29): Instead of covering only a small section of the Smith Chart at high reflection, (dotted circle (33) in FIG. 4, FIG. 7), the new tuners cover the entire Smith Chart at high reflection, (dotted circle (38) in FIG. 5, FIG. 8). The new tuner (29) takes advantage of the pre-matching of the first RF slug (22), but moves it at the same time with the tuning slug (21). The actual vector tuning mechanisms and their basic differences are explained in FIGS. 4 and 5 and shown in practice in FIGS. 7 and 8: The pre-matching reflection vector (36) in synchronized tuner (29) is always in-line with the tuning vector (37) and the last said vector (37) does not rotate around the pre-matching vector (36) and does therefore not cause a change of the amplitude of the total reflection vectors (36+37), which now turn in-phase around the center of the Smith Chart. This is contrary to the situation in ordinary pre-matching tuners (4), where the total reflection vectors (32+34), FIG. 4 varies significantly in amplitude, since the tuning vector (34) rotates around the fixed pre-matching vector (32). Instead in synchronized pre-matching tuners both reflection vectors (36) and (37) rotate simultaneously following the same direction depicted by arrows (40) and their relative angle does not change.

In order to optimize the reflection vector (36+37) of the new tuners (29) the operator must adjust the horizontal and vertical positions of the secondary RF slug (or pre-matching slug, (22)) manually, before the calibration, FIG. 6, and operation of the tuner. This can be done if the vertical stepping motors (15, 16) in the case of an automatic tuner are controlled electrically by parallel wiring (25,26) driven by the same stepping motor control circuitry coming from the direction of (14), which is part of the automatic tuner (29) and is not shown here. In this case a screwdriver is used to rotate manually the axis (60) of the vertical motor and insert the pre-matching slug (22) into the airline (18) after the primary slug (21) has been set to its lowest position (closest to the central conductor (19–20), corresponding to the highest reflection factor (39). At this permanent relative vertical position of both RF slugs (21 and 22), and under on-line measurement on a calibrated Vector Network Analyzer (41), the relative distance (61) between the two RF slugs (21,22) is adjusted manually and secured by means of a steel rod (17) which traverses both carriages (15 and 16) and is fixed with manual set-screws against the walls of said carriages; this allows to have both reflection vector's (36,37) phases equal and aligned best for the frequency band in question, which typically covers several octaves, and the tuner (29) is ready for calibration (FIGS. 5, 8) and operation.

The synchronized pre-matching tuner (46) is calibrated on a Vector Network Analyzer (VNA) (41) as follows:

In a closed logical software loop, and starting at the center (59) of the Smith Chart (55) a set of reflection factor target values (39) is set, like 0.1, 0.2, 0.3 . . . 0.9, FIG. 8; the RF slugs (21,22) are then inserted into the airline (51) by a certain number of steps; the reflection factor is measured by the VNA (41) at its port 1 (47) via a flexible RF cable (44) and corrected to the VNA's (41) internal ports (42, 43) and then compared with the target value. Then the vertical motors (53,54) are moved by a number of steps proportional to the difference between target value and measured value of the tuner reflection factor and insert RF slugs (49,50) into the slabline; vertical movement stops when the expected value of reflection factor is reached, within a small measurement tolerance, and a reflection factor measurement is taken. This is a very efficient iterative process that delivers accurate vertical positioning of the RF slugs (49,50) into the slabline (51), in order to obtain certain reflection factors (58,57,56). Once all vertical positions for a given number of vertical reflection factor values have been determined, these values are saved in memory and successively the tuner is moved and positioned horizontally in a manner as to cover 360° on the Smith Chart (55) (covering a total distance of half a wavelength or λ/2) and generating a set of calibration points (such as 56,57,58,59). At each said tuner position the S-parameters of the tuner twoport are measured on the Vector Network Analyzer (41) and saved in a re-useable data file in form of a matrix on the computer's hard disk with the following format:

{Xpos.i, Ypos.i, S11.i, S12.i, S21.i, S22.i }, where Smn are complex S-parameters in real/imaginary format, {m,n}={1,2} and the index "i" varies between 1 and 200, 400 or 800, depending on the user's calibration density preference. Higher calibration densities are possible, but time consuming and, because of numerical interpolation techniques used, do not necessarily enhance neither the tuning operation nor the accuracy of the system. The tuner calibration data can be retrieved by the load pull (or the noise) operation software and used to reproduce the tuner's impedances as a function of {Xpos, Ypos} positions, FIG. 8, where Xpos and Ypos are the number of motor steps of the stepping motors controlling the tuner's movements, required to move the tuner carriage horizontally (Xpos) and the RF slug vertically (Ypos).

Although the present invention has been explained hereinabove by way of a preferred embodiment thereof, it should be pointed out that any modifications to this preferred embodiment within the scope of the appended claims is not deemed to alter or change the nature and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim invention of the following items:

1. An automatic electromechanical microwave tuner comprising a slotted straight transmission airline between two ports, a test port, which is closest to the device under test (DUT) and an idle port, and two mobile carriages moving in parallel to the axis of said airline, of which said carriages one is the master carnage and the other the slave carriage, said master carnage being driven by a horizontal stepper motor and said slave carriage being attached at an adjustable distance to said master carriage by means of a solid bar and being forced to move simultaneously with said master carriage; each said carriage including a vertically movable microwave probe, each said probe being driven by a vertical stepper motor and being able to be inserted into the slot of said airline, in order to create adjustable microwave reflection.

2. An automatic tuner, as in claim 1, in which both said microwave probes move simultaneously in and out of said slotted airline and their vertical position is adjusted in order to be at the same distance from the central conductor of the airline; the synchronization of the vertical movement of both said probes is achieved by applying simultaneously the same electrical signals to the vertical motors of both said carriages.

3. A method for manually adjusting and securing the horizontal distance between the microwave probes of an automatic microwave tuner, as in claim 2, in order to obtain maximum reflection factor at a given frequency, in three steps; in step 1 both ports of said tuner are connected with both test ports of a calibrated vector network analyzer (VNA); in step 2 both microwave probes are inserted at their closest position to the center conductor of said slotted airline, a position which delivers maximum reflection factor for each said probe individually; in step 3 the horizontal distance between said two carriages is adjusted, starting at the closest distance between said carriages and moving said slave carriage, manually, slowly away from said master carriage, observing at all times at said VNA the reflection factor at said tuner test port, until the reflection factor reaches a maximum, and securing this optimum position by means of a fastening screw.

4. A tuner calibration method on a Vector Network Analyzer (VNA), in which the vertical position of said microwave probes of a tuner as in claim 1, is adjusted automatically in a closed search loop, in which the reflection factors are measured as a function of the distance between said microwave probes and the central conductor of said airline and their subsequent horizontal positioning is used in order to generate concentric reflection factor circles on the Smith Chart automatically, whereas the calibration procedure then continues by positioning said microwave probes of said tuner vertically and horizontally in such a manner as to cover the Smith Chart area in a best-distributed and equidistant manner, while the S-parameters of the tuner twoport are measured and saved in reusable calibration data files.

* * * * *